United States Patent [19]
Fan et al.

[11] Patent Number: 5,760,880
[45] Date of Patent: Jun. 2, 1998

[54] LASER APPARATUS

[75] Inventors: Roxy Ni Fan, East Brunswick, N.J.; Carol M. Van Zoeren, Wilmington, Del.

[73] Assignee: E. I. du Pont de Nemours and Company, Wilmington, Del.

[21] Appl. No.: 818,796

[22] Filed: Jul. 31, 1997

Related U.S. Application Data

[62] Division of Ser. No. 432,411, May 1, 1995.

[51] Int. Cl.$^6$ ................................................ G03B 27/54
[52] U.S. Cl. .................................................... 355/67
[58] Field of Search ............................ 430/201, 271.1, 430/273.1, 306, 944, 945, 309; 347/236; 101/467; 346/108; 355/67, 51, 50, 57, 60, 20

[56] References Cited

U.S. PATENT DOCUMENTS

| | | | |
|---|---|---|---|
| 4,323,637 | 4/1982 | Chen et al. | 430/271 |
| 4,427,749 | 1/1984 | Graetzel et al. | 429/111 |
| 5,262,275 | 11/1993 | Fan | 430/273 |
| 5,278,023 | 1/1994 | Bills | 430/201 |
| 5,327,167 | 7/1994 | Pollard et al. | 346/108 |
| 5,385,092 | 1/1995 | Lewis et al. | 101/467 |
| 5,506,086 | 4/1996 | Van Zoeren | 430/201 |
| 5,579,044 | 11/1996 | Warner et al. | 347/236 |

FOREIGN PATENT DOCUMENTS

| | | | |
|---|---|---|---|
| A 43 13 111 | 10/1994 | Germany | G03F 7/24 |
| WO A 92 02859 | 2/1992 | WIPO | G03F 7/095 |
| 94-03839 | 2/1994 | WIPO | 430/944 |

OTHER PUBLICATIONS

Fan, R.N., U.S. Appln. No. 081130,610, Oct. 1, 1993 (IM–0672–A).
Fan, R.N., U.S. Appln. No. 08/341,731, Nov. 18, 1994 (IM–0672–B).
Van Zoeren, C., U.S. Appln. No., 08/431,600, May 1, 1995 (IM–0971).
Fan, R.N., U.S. Appln. No. 08/432,450, May 1, 1995 (IM–1002).
Siegman, A.E., New Developments in Laser Resonators., *SPIE*, vol. 1224, Jan., 1990.
Johnston, Jr., T.F., $M^2$ Concept Characterizes Beam Quality, *Laser Focus World*, 173–183, May, 1990.
Sasnett, M.W., Characterization of Laser Beam Propagation, *Coherent*, Sep., 1990.
*Grapholas–Laser Technology Blazes a Trail for the Printing Industry*, Baasel Lasertechnik GmbH, Starnberg, Germany, Jun., 1991.
*Grapholas Highlights—Trends and Activities in Laser Engraving*, Baasel Lasertechnik GmbH, Starnberg, Germany, Sep., 1991.
*Grapholas—Highlights of Laser Engraving*, Baasel Lasertechnik GmbH, Starnberg, Germany, no date.
*Grapholas Systems . . . Advanced Laser Engraving for the Printing Industry*, Baasel Scheel Lasergraphics GmbH, Itzehoe, Germany, May 4, 1995.
Kellogg, R.E., et al., *Journal of Imaging Science and Technology*, vol. 36, No. 3, May/Jun. 1992, pp. 220–224.

*Primary Examiner*—D. Rutledge

[57] ABSTRACT

This invention relates to an apparatus for imagewise exposing an infrared sensitive layer and, more specifically, for imagewise ablating an infrared radiation sensitive layer of a flexographic printing element for use in making a flexographic printing plate.

13 Claims, 4 Drawing Sheets

LASER APPARATUS

This is a divisional of application Ser. No. 08/432,411, filed May 1, 1995.

BACKGROUND OF THE INVENTION

1. Field of the Invention

This invention relates to an apparatus and process for imagewise exposing an infrared sensitive layer and, more specifically, for imagewise ablating an infrared radiation sensitive layer of a flexographic printing element for use in making a flexographic printing plate.

2. Description of Related Art

Flexographic printing plates are well known for use in letterpress printing, particularly on surfaces which are soft and easily deformable, such as packaging materials, e.g., cardboard, plastic films, etc. Flexographic printing plates can be prepared from photopolymerizable compositions, such as those described in U.S. Pat. No. 4,323,637 and 4,427,749. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, polymerization, and hence, insolubilization of the photopolymerizable layer occurs in the exposed areas. Treatment with a suitable solution removes the unexposed areas of the photopolymerizable layer leaving a printing relief which can be used for flexographic printing.

Imagewise exposure of a photosensitive element requires the use of a phototool which is a mask having clear and opaque areas covering the photopolymerizable layer. The phototool prevents exposure and polymerization in the opaque areas. The phototool allows exposure to radiation in the clear areas so that these areas polymerize and remain on the support after the development step. The phototool is usually a photographic negative of the desired printing image. If corrections are needed in the final image a new negative must be made. This is a time-consuming process. In addition, the phototool may change slightly in dimension due to changes in temperature and humidity. Thus, the same phototool, when used at different times or in different environments, may give different results and could cause registration problems.

Thus, it would be desirable to eliminate the phototool by directly recording information on a photosensitive element, e.g., by means of a laser beam. The image to be developed could be translated into digital information and the digital information used to place the laser for imaging. The digital information could even be transmitted from a distant location. Corrections could be made easily and quickly by adjusting the digitized image. In addition, the digitized image could be either positive or negative, eliminating the need to have both positive-working and negative-working photosensitive materials, or positive and negative phototools. This saves storage space and, thus, reduces cost. Another advantage is that registration can be precisely controlled by machine during the imaging step. Digitized imaging without a phototool is particularly well-suited for making seamless, continuous printing forms.

In general, it has not been very practical to use lasers to image the elements which are used to prepare flexographic printing plates. The elements have low photosensitivity and require long exposure times even with high powered lasers. In addition, most of the photopolymerizable materials used in these elements have their greatest sensitivity in the ultraviolet range. While UV lasers are known, economical and reliable UV lasers with high power are generally not available. However, non-UV lasers are available which are relatively inexpensive, and which have a useful power output and which can be utilized to form a mask image on top of flexographic printing elements.

In view of these facts, a photosensitive printing element 10 has recently been developed for use in preparing flexographic print plates. Referring from bottom to top in FIG. 1, the photosensitive printing element comprises, in order, a support or cushion layer 12, at least one photopolymerizable layer 14 which is substantially insensitive to infrared radiation, one or more optional barrier layer 16, and at least an infrared radiation sensitive layer 18. A removable protective coversheet 22 with an optional release layer 20 cover and protect the outer infrared radiation sensitive layer 18. See, for instance, U.S. Pat. No. 5,262,275 and U.S. patent application Ser. Nos. 08/130,610 and 08/341,731. Also see U.S. patent applications IM-1002 and IM-0971, U.S. Pat. No. 5,506,086 assigned to E. I. du Pont de Nemours and Company and filed on the same day as this application. The process of using these photosensitive printing elements involves (1) removing any protective coversheet 22 and the release layer 20, if present; (2) imagewise ablating the infrared-sensitive layer 18 to form a mask; (3) overall exposing the photosensitive element 10 to non-infrared actinic radiation through the mask; and (4) treating the product of step (3) with at least one developer solution to remove (i) the infrared-sensitive material which was not removed during step (2), (ii) at least the areas of any barrier layer 16, if present, which were not exposed to non-infrared actinic radiation, and (iii) the areas of the photopolymerizable layer 14 which were not exposed to non-infrared actinic radiation. The treating step (4) produces a flexographic printing plate with a relief surface or image which is inked and used for flexographic printing of typically multiple copies of the inked portions of the relief surface or image.

Conventional laser engraving systems are available for directly engraving relief images in materials for directly producing relief printing surfaces. Typical laser engravers use $CO_2$ lasers which emit a highly multi-mode beam having a wavelength of about 10.6 microns which are very powerful lasers that would burn through or vaporize most polymers including polymers in conventional flexographic printing elements and the entire elements disclosed in U.S. Pat. No. 5,262,275, U.S. patent application Ser. Nos. 08/130,610 and 08/341,731, and U.S. patent applications IM-1002 and IM-0971 now U.S. Pat. No. 5,506,080. Such engravers typically have a minimum resolution or beam diameter of about 40 microns which is much too large for creating a high resolution flexographic printing mask. The maximum modulation rate of a $CO_2$ laser is about 20 kHz which causes the maximum engraving speed to be too slow for a commercially viable system for forming high resolution mask layers on flexographic printing elements.

The Grapholas® system made and sold by Baasel-Scheel Lasergraphics, Gmbh, of Itzehoe, Germany, is for directly engraving relief images in a layer for directly producing relief printing surfaces. The Grapholas® system comprises:

a support assembly including:
      a support,
      a drum rotatably mounted on the support, the drum having an outer cylindrical surface, the layer adapted to be mounted on the cylindrical surface, and
      a drum motor assembly mounted on the support, the drum motor assembly for rotating the drum with a maximum speed of about 200 rpm;

a $CO_2$ laser assembly for producing an image modulated beam;

an optical assembly including:
  a lens for focusing the directed beam having a minimum resolution of about 40 microns at the layer on the cylindrical surface, and
  a focusing motor assembly for moving the lens with respect to the layer on the cylindrical surface to focus the modulated beam such that the focused modulated beam is adapted to engrave the layer;

a modulated beam delivery carriage assembly including:
  a carriage for supporting the optical assembly,
  a linear track along which the carriage is adapted to move, the track being parallel to the longitudinal axis, and
  a translator motor assembly for transporting the carriage along the track to scan the image modulated beam along the layer on the cylindrical surface at a carriage advance rate of about an engraving width of the modulated beam on the layer on the cylindrical surface;

a computer assembly for (i) receiving, generating and/or storing the image data representing an image to be engraved in the layer, and (ii) selecting exposure parameters from a set consisting of the cylindrical surface speed, the support advance rate, image placement coordinates on the layer, focusing position, and amplitude modulation level; and an electronic control assembly for receiving the image data and the exposure parameters from the computer assembly and processing the image data and the exposure parameters to control the support assembly, the laser assembly, the optical assembly, and the linear transport mechanism to engrave the image in a spiral fashion in the layer.

Another engraving system previously made and sold by Baasel Lasertechnik, Gmbh called the Grapholas® Compact system was also for directly engraving relief images in a layer for directly producing relief printing surfaces. The Grapholas® Compact system comprised:

a support assembly including:
  a support,
  a drum rotatably mounted on the support, the drum having an outer cylindrical surface, the layer adapted to be mounted on the cylindrical surface, and
  a drum motor assembly mounted on the support, the drum motor assembly for rotating the drum with a maximum speed of about 106 rpm;

a laser assembly for producing an image modulated beam, the laser assembly comprising:
  a Nd:YAG laser for emitting an output infrared radiation beam,
  a laser power supply for energizing the laser, and
  a Q-switch for image modulating the output infrared radiation beam;

a stationary (i.e., fixed) optical assembly including:
  a lens for focusing the directed beam at the layer on the cylindrical surface, and
  a focusing motor assembly for moving the lens with respect to the layer on the cylindrical surface to focus the modulated beam such that the focused modulated beam is adapted to engrave the layer;

a linear transport mechanism for transporting the support, the drum and the drum motor assembly along a line to scan the image modulated beam along the layer on the cylindrical surface at a carriage advance rate of about an engraving width of the modulated beam on the layer on the cylindrical surface;

a computer assembly for (i) receiving, generating and/or storing the image data representing an image to be engraved in the layer, and (ii) selecting exposure parameters from a set consisting of the cylindrical surface speed, the support advance rate, image placement coordinates on the layer, focusing position, and amplitude modulation level; and an electronic control assembly for receiving the image data and the exposure parameters from the computer assembly and processing the image data and the exposure parameters to control the support assembly, the laser assembly, the optical assembly, and the linear transport mechanism to engrave the image in a spiral fashion in the layer.

Since the structure and properties of the photosensitive printing elements disclosed in U.S. Pat. No. 5,262,275, U.S. patent application Ser. Nos. 08/130,610 and 08/341,731, and U.S. patent applications IM-1002 and IM-0971 U.S. Pat. No. 5,506,086 are different than other materials that have been engraved by conventional engraving machines, such machines are not capable of forming a mask from the infrared radiation sensitive layer of the photosensitive printing elements disclosed in U.S. Pat. No. 5,262,275, U.S. patent application Ser. Nos. 08/130,610 and 08/341,731, and U.S. patent applications IM-1002 and IM-0971 U.S. Pat. No. 5,506,086 in a commercially viable manner.

In fact, since these unique photosensitive printing elements were only recently developed, no apparatus is commercially available which is capable of ablating the infrared radiation sensitive layer of these photosensitive printing elements to form a suitable mask for use in preparing flexographic printing plates with desired productivity and image quality.

SUMMARY OF THE INVENTION

The invention provides an apparatus for imagewise exposing an infrared sensitive layer, the apparatus comprising:

a support assembly including:
  a rotatable cylindrical surface having a longitudinal axis, the layer adapted to be mounted on the cylindrical surface, and
  a motor assembly for rotating the cylindrical surface;

a laser assembly for producing an image modulated beam;

an optical assembly including:
  a lens for focusing the directed beam at the layer on the cylindrical surface, and
  a focusing motor assembly for moving the lens with respect to the layer on the cylindrical surface to focus the modulated beam such that the focused modulated beam is adapted to engrave the layer;

a modulated beam delivery carriage assembly including:
  a carriage for supporting the optical assembly,
  a linear track along which the carriage is adapted to move, the track being parallel to the longitudinal axis, and
  a translator motor assembly for transporting the carriage along the track to scan the image modulated beam along the layer on the cylindrical surface at a carriage advance rate of about an exposing width of the modulated beam on the layer on the cylindrical surface;

a computer assembly for (i) receiving, generating and/or storing image data representing an image to be exposed on the layer, and (ii) selecting exposure parameters from a set consisting of the cylindrical surface speed, the carriage advance rate, image placement coordinates on the layer, focusing position, and amplitude modulation level; and an electronic control assembly for receiving the image data and the exposure parameters from the computer assembly and processing the image data and the exposure parameters to control the support assembly, the laser assembly, the optical assembly, and the modulated beam delivery carriage assembly to expose the image in a spiral fashion in the layer; and wherein the improvement comprises:

the focused modulated beam comprises infrared radiation having a peak power density of 0.1 megaWatts/$cm^2$ to 17 megaWatts/$cm^2$ and is adapted to provide an energy density of 0.5 Joules/$cm^2$ to 5 Joules/$cm^2$ on the layer.

The invention is further directed to a process for making a flexographic printing plate, comprising:

(1) providing a photosensitive printing element comprising in the order listed:
  (a) a support layer,
  (b) at least a photopolymerizable layer comprising an elastomeric binder, at least a monomer and at least an initiator having sensitivity to non-infrared actinic radiation, said photopolymerizable layer being soluble, swellable or dispersible in a developer solution;
  (c) optionally at least a barrier layer which is substantially transparent to non-infrared actinic radiation; and
  (d) at least a layer of infrared radiation sensitive material which is substantially opaque to non-infrared actinic radiation;

(2) imagewise ablating layer (d) with an infrared laser radiation beam having a peak power density of 0.1 megaWatts/$cm^2$ to 17 megaWatts/$cm^2$ and adapted to provide an energy density of 0.5 Joules/$cm^2$ to 5 Joules/$cm^2$ from a laser ablating apparatus to form a mask, the apparatus comprising a support assembly, a laser assembly, an optical assembly, a modulated beam delivery carriage assembly, a computer assembly, and an electronic control assembly;

(3) overall exposing the photosensitive element to non-infrared radiation actinic radiation through the mask; and (4) treating the product of step (3) with at least one developer solution to remove (i) the infrared-sensitive layer which was not removed during step (2), (ii) at least areas of the barrier layer, if present, which were not exposed to non-infrared actinic radiation, and (iii) areas of the photopolymerizable layer (b) which were not exposed to non-infrared actinic radiation.

BRIEF DESCRIPTION OF THE DRAWINGS

The invention can be more fully understood from the following detailed description thereof in connection with accompanying drawings described as follows.

DESCRIPTION OF THE PREFERRED EMBODIMENT(S)

Throughout the following detailed description, similar reference characters refer to similar elements in all figures of the drawings.

Figure 2:
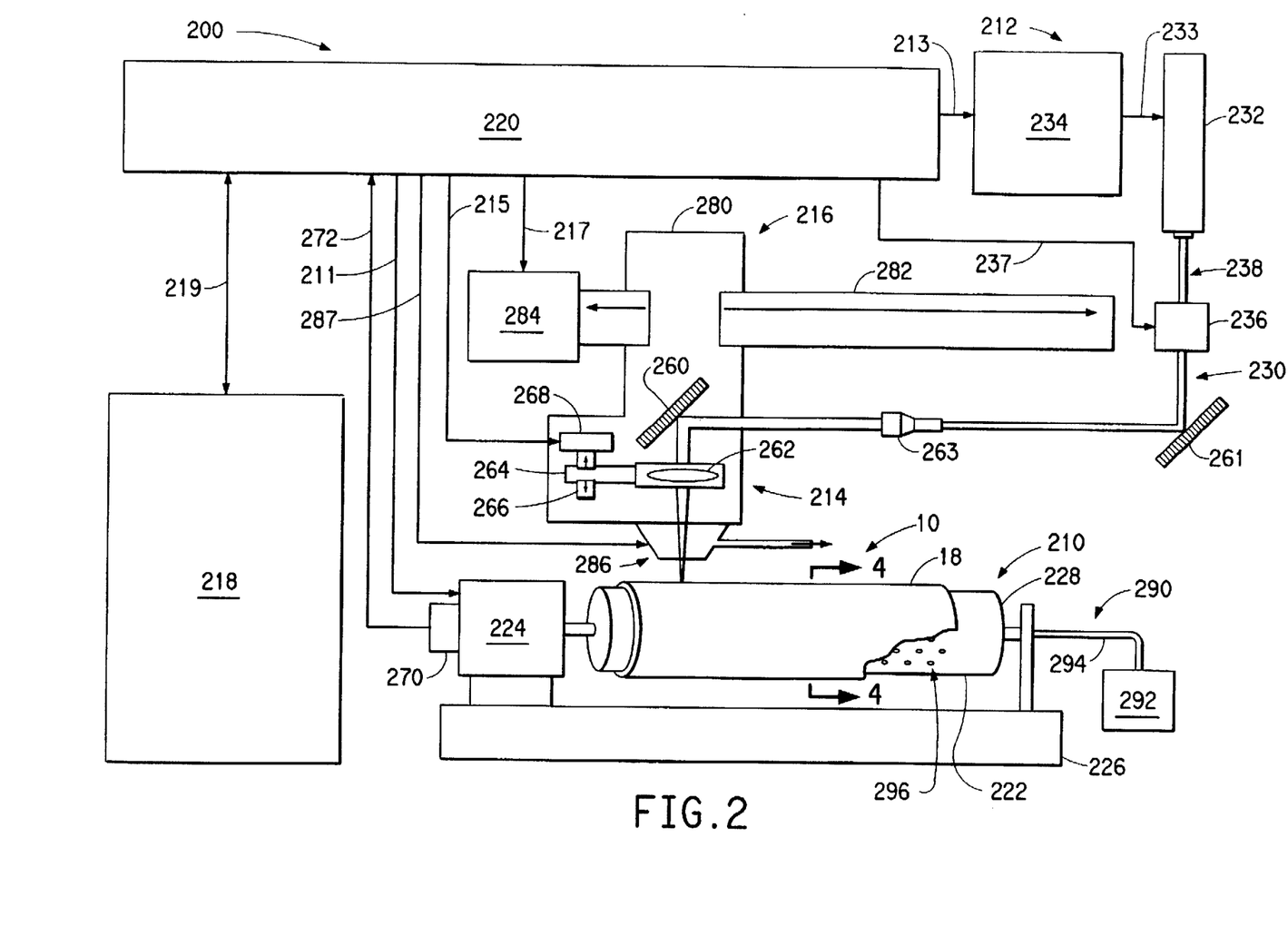
FIG. 2 schematic illustration of an apparatus for ablating an image in the infrared radiation sensitive mask layer of the photopolymer flexographic printing element of FIG. 1 in accordance with the present invention.

Referring to FIG. 2, there is an apparatus 200 for exposing an image in at least one infrared radiation sensitive layer 18 of a photosensitive material or element 10 in accordance with the present invention. The layer 18 can be any infrared sensitive layer where exposure to infrared radiation causes a physical or chemical change to material in the layer 18. Such changes include melting, hardening, softening, removing, color density changes, etc.

Figure 1:
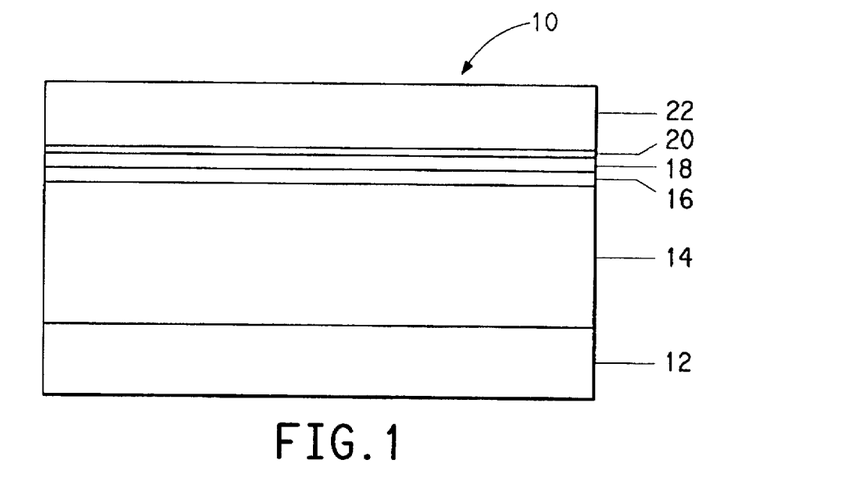
FIG. 1 is a side or edge view of a recently invented photosensitive flexographic printing element, comprising, in order, from bottom to top, a support, a photopolymerizable layer which is substantially insensitive to infrared radiation, one or more optional barrier layer, an infrared radiation sensitive layer, an optional release layer, and a protective cover layer.

As shown in FIG. 1, the photosensitive element 10 preferably comprises a flexographic printing element or material 10 comprising, in order, a support or cushion layer 12, at least a photopolymerizable layer 14 which is substantially insensitive to infrared radiation, one or more optional barrier layer 16, and the at least one infrared radiation sensitive layer 18. Hereafter, when a single layer is mentioned, it is to be understood that the layer can be made of a plurality of layers of the same or varying thickness where the layers comprise the same or different composition. The layer 18 is ablatable by radiation having a peak power density of 0.1 megaWatts/$cm^2$ to 17 megaWatts/$cm^2$ and an energy density of 0.5 Joules/$cm^2$ to 5 Joules/$cm^2$ without ablating or polymerizing the photopolymerizable layer 14. Preferably, the layer 18 is ablatable by radiation having a peak power density of 0.5 megaWatts/$cm^2$ to 9 megaWatts/$cm^2$ and an energy density of 1 Joules/$cm^2$ to 3 Joules/$cm^2$ without ablating or polymerizing the photopolymerizable layers 14. Most preferably, the layer 18 is ablatable by radiation having a peak power density of 2 megaWatts/$cm^2$ to 7 megaWatts/$cm^2$ and an energy density of 1.4 Joules/$cm^2$ to 2.7 Joules/$cm^2$ without ablating or polymerizing the photopolymerizable layer 14.

The photosensitive element 10 can also include a temporary coversheet 22 on top of the infrared-sensitive layer 18. The purpose of the coversheet 22 is to protect the infrared-sensitive layer 18 during storage and handling. It is important that the coversheet 22 be removed prior to exposing the infrared-sensitive layer 18 to infrared laser radiation. An optional release layer 20 can be interposed between the coversheet 22 and the infrared-sensitive layer 18 to facilitate removal of the coversheet 22 from the infrared radiation sensitive layer 18. The optional release layer 20 is preferably removed with the coversheet 22. The photopolymerizable layer 14 comprise an elastomeric binder, at least a monomer and at least an initiator having sensitivity to non-infrared actinic radiation. The photopolymerizable layer 14 is soluble, swellable or dispersible in a developer solution. The barrier layer 16 is substantially transparent to non-infrared actinic radiation. Preferably, the barrier layer 16 is soluble, swellable, dispersible, or liftable in the developer solution for the photopolymerizable layer 14. The infrared radiation sensitive layer 18 is substantially opaque to non-infrared actinic radiation. Suitable preferred photosensitive printing elements 10 are disclosed in U.S. Pat. No. 5,262,275, U.S. patent application Ser. Nos. 08/130,610 and 08/341,731, and U.S. patent applications IM-1002 and IM-0971, U.S. Pat. No. 5,506,086 which are hereby incorporated by reference.

The thickness of the infrared-sensitive layer 18 should be in a range to optimize both sensitivity and opacity. The layer 18 should be thin enough to provide good sensitivity, i.e., the infrared-sensitive layer 18 should be removed rapidly upon exposure to infrared laser radiation. At the same time, the layer 18 should be thick enough so that areas of the layer 18 which remain on the photopolymerizable layer 14 after imagewise exposure effectively mask the photopolymerizable layer 14 from non-infrared actinic radiation. In general, the infrared-sensitive layer 18 will have a thickness from about 20 Angstroms to about 50 micrometers. It is preferred that the thickness be from 40 Angstroms to 40 micrometers.

The apparatus 200 comprises an element support assembly 210, a laser assembly 212, an optical assembly 214, a modulated beam delivery carriage assembly 216, a computer assembly 218, and an electronic control assembly 220.

Figure 4:
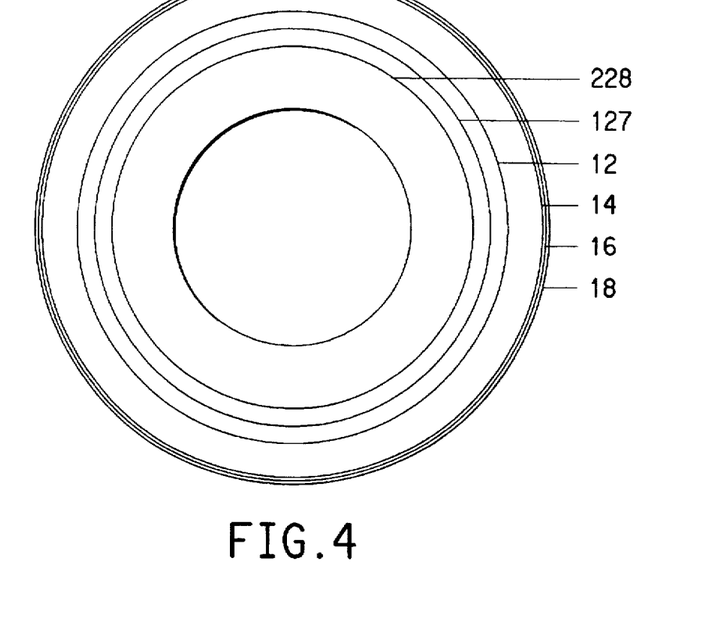
FIG. 4 is a cross sectional view of a first arrangement of the element on a first rotatable drum generally along line 4—4 in FIG. 2 in the direction of the arrows.

The element support assembly 210 includes a rotatable cylindrical surface 222 and an element rotator motor assembly 224. The element support assembly 210 further comprises a stationary support frame 226 and a rotatable element support mechanism 228 supporting the cylindrical surface 222 which is rotatably supported at end portions by the support frame 226. The mechanism 228 can be a drum or shaft where an outer surface of the drum or shaft is the cylindrical surface 222. Alternatively, the mechanism 228 can be a mandrel or cylindrical axle 228 for inserting through a support sleeve 126 which comprises the cylindrical surface 222. The support sleeve 126 can be any material including a polymer, such as polyester, or a metal, such as nickel or a nickel alloy. See FIG. 5. When the cylindrical surface 222 is an outer surface of the support sleeve 126, one end of the support frame 226 can be moved with respect to the drum 228 so the support sleeve 126 can be slid onto the drum 228. In another embodiment, the mechanism 228 is a set of support end caps or hubs for inserting in and holding ends of the support sleeve 126 in which case the support sleeve 126 again comprises the cylindrical surface 222. The cylindrical surface 222 has a longitudinal axis which is coincident with a longitudinal axis of the mechanism 228 (and the sleeve 126 when mounted on the mechanism 228). In each case, the cylindrical surface 222 has a preferred circumference of 24 inches to 50 inches. In a first arrangement illustrated in FIGS. 4 and 5, the photopolymer printing material 10 is adapted to be mounted on the cylindrical surface 222 with the infrared radiation sensitive layer 18 facing radially away from the cylindrical surface 222. In a second arrangement illustrated in FIG. 6, the photopolymer printing material 10 is adapted to be mounted on the cylindrical surface 222 with the infrared radiation sensitive layer 18 facing radially towards the cylindrical surface 222. The element rotator motor assembly 224 is for rotating the cylindrical surface 222 and thereby the element 10 mounted on the cylindrical surface 222. Referring to FIG. 4, the temporary coversheet 22 and the release layer 20, if present, should be removed prior to mounting the element 10 on the mechanism 228 and thus prior to imagewise ablation of the infrared sensitive layer 18. Referring back to FIG. 2, the element rotator motor assembly 224 is capable of rotating the cylindrical surface 222 at a speed of about 500 to about 2500 revolutions per minute. Preferably, the element rotator motor assembly 224 rotates the cylindrical surface 222 at a speed of about 700 to about 2500 revolutions per minute, and most preferably at a speed of about 1000 to about 2000 revolutions per minute. Surface velocity of a point on the cylindrical surface 222 is about 5 meters/second to about 53 meters/second.

The laser assembly 212 is for producing an image modulated beam 230. The laser assembly 212 comprises a laser 232, a laser power supply 234 and an acousto-optic modulator assembly 236. The laser 232 is for emitting an output infrared radiation beam 238 having a $M^2$ beam quality value or factor of 4 to 8 and a maximum power of about 50 Watts to 70 Watts. Preferably, the beam 238 has a $M^2$ beam quality value of 5 to 7 and, most preferably, a $M^2$ beam quality value of 5.5 to 6.5. For articles defining, and describing methods of measuring, the $M^2$ beam quality value of lasers, see A. E. Siegman, New Developments in Laser Resonators, SPIE Vol. 1224, Optical Resonators (1990); T. F. Johnson, Jr., $M^2$ Concept Characterizes Beam Quality, Laser Focus World, May 1990; and M. W. Sasnett, Characterization of Laser Beam Propagation, Coherent, September 1990. The laser output beam 238 has a $1/e^2$ irradiance diameter at its waist diameter of 2 millimeters to 3 millimeters.

Various infrared lasers can be used. Diode lasers emitting in the region of 750 to 880 nm offer substantial advantages in terms of their small size, low cost, stability, reliability, ruggedness and ease of modulation. Diode lasers emitting in the range of 780 to 850 nm are preferred. Such lasers are commercially available from, for example, Spectra Diode Laboratories (San Jose, Calif.). Most preferably, the laser 232 is a Nd:YAG laser which is adapted to emit at about 1064 nm. The laser power supply 234 is for energizing the laser 232 over line 233. The acousto-optic modulator assembly 236 is for modulating the laser output beam 238 with image data and for producing the image modulated beam 230 which can be a first order beam having a maximum power of about 22 Watts to about 32 Watts. The image modulated beam 230 has a wavelength of about 780 nanometers to about 2000 nanometers. Preferably, the acousto-optic modulator assembly 236 is adapted to provide an image modulation rate in a range of about 0.5 megabits/ second to about 1.0 megabits/second.

Figure 3:
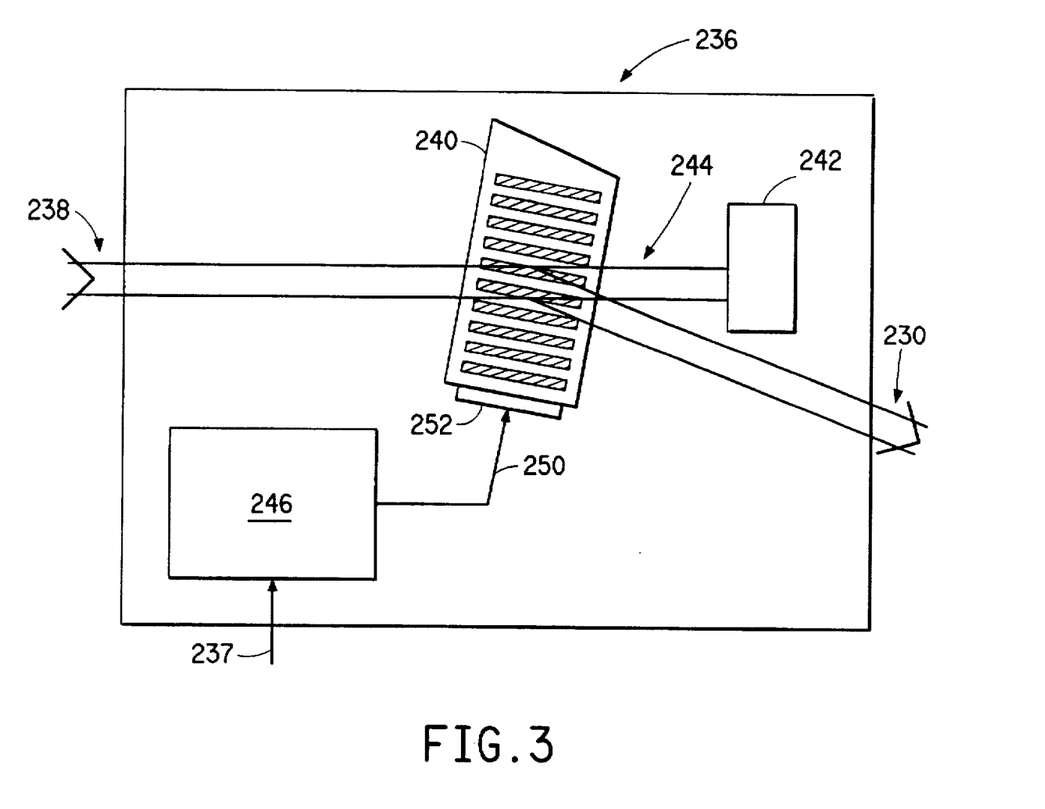
FIG. 3 is a schematic illustration of an acousto-optic modulator assembly for modulating a laser output beam with image data.

Referring to FIG. 3, the acousto-optic modulator assembly 236 comprises an acousto-optic modulator 240 and a beam dump 242. The acousto-optic modulator 240 is for diffracting a first order beam portion (which in FIG. 3 is beam 230) of the laser output beam 238 and passing a zero order beam portion 244 of the laser output beam 238. The beam dump 242 is for blocking either the first order beam portion 230 of the laser output beam 238 or the zero order beam portion 244 of the laser output beam 238. The acousto-optic modulator assembly 236 further comprises a radio frequency (RF) driver 246 which receives image data over a line 237 from the electronic control assembly 220. The RF driver 246 sends an RF drive signal over a line 250 to a transducer 252 of the acousto-optic modulator 240. A suitable acousto-optic modulator 240 is commercially available under model number AOM-40R from IntraAction Corporation of Bellwood, Ill. A suitable RF driver 246 is commercially available under model ME (Signal Processor) also from IntraAction Corporation.

Referring back to FIG. 2, the optical assembly 216 includes a lens 262 mounted on a lens support 264, a linear track 266, and a focusing motor assembly 268. Preferably, a reflector 260 is included in the optical assembly 216. The reflector 260 is for directing the image modulated beam 230 onto the infrared sensitive layer 18 of the material 10 on the cylindrical surface 222. The lens 262 is for focusing the directed beam at the infrared sensitive layer 18 of the material 10 on the cylindrical surface 222. The modulated beam focused by the lens 262 comprises infrared radiation having a peak power density of 0.1 megaWatts/cm$^2$ to 17 megaWatts/cm$^2$ and provides an energy density of 0.5 Joules/cm$^2$ to 5 Joules/cm$^2$ on the layer 18. Preferably, the focused modulated beam has a peak power density of 0.5 megaWatts/cm$^2$ to 9 megaWatts/cm$^2$ and provides an energy density of 1 Joules/cm$^2$ to 3 Joules/cm$^2$. Most preferably, the focused modulated beam has a peak power density of 2 megaWatts/cm$^2$ to 7 megaWatts/cm$^2$ and provides an energy density of 1.4 Joules/cm$^2$ to 2.7 Joules/cm$^2$. The lens 262 is adapted to focus the directed beam to have a 1/e$^2$ irradiance diameter of 15 µm to 30 µm at the infrared sensitive layer 18 of the material 10 on the cylindrical surface 222. Preferably, the lens 262 focuses the beam to a 1/e$^2$ irradiance diameter of 20 µm to 25 µm at the infrared sensitive layer 18. The focusing motor assembly 268 is for moving the lens 262 with respect to the infrared sensitive layer 18 of the material 10 on the cylindrical surface 222 to focus the modulated beam such that the focused modulated beam is adapted to ablate the infrared sensitive layer 18. The linear track 266 can be a worm gear connected at one end to a drive shaft of the focusing motor assembly 268. The worm gear 266 can be adapted to engage a mating socket in the lens support 264 such that when the focusing motor assembly 268 rotates the worm gear 266, the lens support 264 and the lens 262 move linearly along the track 266. The optical assembly 216 can be mounted on a carriage 280 which can block rotational movement of the lens support 264 during its linear movement along the track 266. The laser assembly 212 can be mounted on the carriage 280 in which case the reflector 260 is unnecessary. One or more additional reflector 261 can be used to direct the beam 230 onto the reflector 260 or lens 262 in order to position the laser 232 in a compact position in the apparatus 200. If needed, a beam expander 263 can be use to increase the diameter of the modulated beam 230.

Assuming a Gaussian laser beam, the peak power density or irradiance occurs at the center of the beam and is given by Formula I below.

$$\text{Peak Power Density} = \frac{8 P_T}{\pi d_o^2} \quad (I)$$

where $P_T$=Total Power (Watts) in beam; and $d_o$=1/e$^2$ irradiance diameter of beam.

For instance, where $P_T$=10 Watts and $d_o$=25 microns:

$$\text{Peak Power Density} = \frac{[8][10 \text{ Watts}]}{[\pi][.0025 \text{ cm}]^2}$$

$$= 4.1 \text{ megaWatts/cm}^2$$

Further, the Energy Density or Exposure delivered to an area on an outer circumferencial surface of a drum is given by Formula II below.

$$\text{Energy Density} = \frac{P_T}{[rps][D_c][W_A]} \quad (II)$$

where $P_T$=Total Power (Watts or Joules/sec) in beam;

rps=drum revolutions each second;

$D_c$=drum circumference (cm); and $W_A$=advance width (cm) of beam along longitudinal axis of drum each revolution of the drum.

For instance, when $P_T$=10 Watts, drum circumference=75 cm, advance width=25 microns:

$$\text{Energy Density} = \frac{[10 \text{ Watts}]}{[1500 \text{ revs/60 sec}][75 \text{ cm}][.0025 \text{ cm}]}$$

$$= 2.1 \text{ Joules/cm}^2$$

When the modulated beam 230 is focused on the infrared sensitive layer 18, material in the infrared-sensitive layer 18 is removed, i.e., ablated or engraved, in the areas exposed to the infrared laser radiation. For the purposes herein, the term "ablated" means removed by cutting, erosion, melting, evaporation, burning, decomposition, vaporization or the like. In the printing field, the term "engrave" is defined as to impress deeply to cut figures, letters, or images into a substrate to form a relief surface to be inked in the printing process. In a preferred use of the apparatus 200 to make flexographic printing plates, the term "engrave" is defined to be synonymous with the word "ablate" with the understanding that the depth of material removed is much less than prior engraving processes, the material being removed is different than in prior engraving processes, and the resulting engraved layer is used as a photomask for forming a printing relief surface from another layer removed from the engraved layer, rather than used as the printing relief surface itself.

The modulated beam delivery carriage assembly 216 includes the carriage 280, a linear track 282 and a translator motor assembly 284. The carriage 280 as stated before supports the optical assembly 214. The carriage 280 is adapted to move linearly along the track 282, for instance, in a manner similar to the way the lens support 264 moves along the track 266. The track 282 is parallel to the longitudinal axis of the cylindrical surface 222. The translator motor assembly 284 is for transporting the carriage 280 along the track 282 to scan the image modulated beam along the infrared sensitive layer 18 of the material 10 on the cylindrical surface 222 at a carriage advance rate of about an ablating width of the modulated beam on the infrared sensitive layer 18 of the material 10 on the cylindrical surface 222.

The computer assembly 218 is for (i) receiving, generating and/or storing the image data representing an image to be ablated in the infrared radiation sensitive layer 18, and (ii) selecting exposure parameters from a set consisting of the speed of the cylindrical surface 222, the advance rate of the carriage 280, image placement coordinates on the infrared radiation sensitive layer 18, focus position of the lens 262, and amplitude modulation level provided by the acousto-optic modulator assembly 236.

The electronic control assembly 220 is for receiving the image data and the exposure parameters from the computer assembly 218 over line 219 and processing the image data and the exposure parameters to control the support assembly 210 over line 211 to the motor assembly 224, the laser assembly 212 over lines 213 and 237, the optical assembly 214 over line 215 to the motor assembly 268, and over line 217 to the motor assembly 284 of the modulated beam delivery carriage assembly 216 to ablate the image in a spiral fashion in the infrared radiation sensitive layer 18 without ablating or polymerizing the photopolymerizable layer 14 beneath the infrared sensitive layer 18. See FIG. 4. An encoder 270 which is connected to the motor assembly 224 provides feedback on the operation of the motor assembly 224 to the electronic control assembly 220 over line 272. The electronic control assembly 220 is also adapted to control the acousto-optic modulator assembly 236 over line 237. The electronic control assembly 220 is further adapted to be used to select at least one exposure parameter from a set consisting of the cylindrical surface speed, the carriage advance rate, the image placement coordinates on the infrared radiation sensitive layer 18, the lens focus position and the amplitude modulation level.

The ablating apparatus 200 preferably further comprises a debris extraction system 286 for removing ablated material. Then the electronic control assembly 220 would be adapted to control the debris extraction system 286 over line 287. The debris extraction system 286 can be mounted on, and thereby move with, the carriage 280. The debris extraction system 286 can be the same as or similar to the debris extraction system in any of the commercially available Grapholas® systems.

Figure 5:
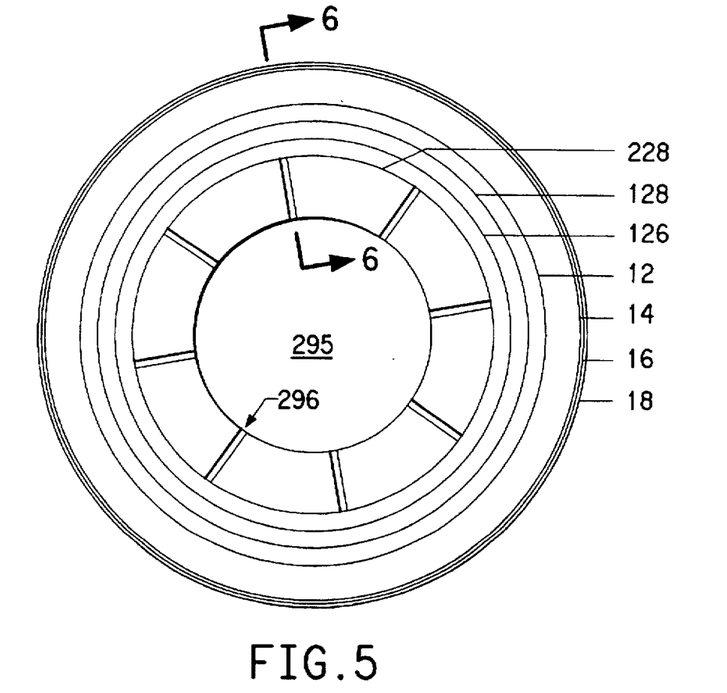
FIG. 5 is a cross sectional view of a second arrangement of the element on a sleeve which in turn is on a second rotatable drum generally along line 4—4 in FIG. 2 in the direction of the arrows.

The ablating apparatus 200 preferably further comprises means for mounting the material 10 on the cylindrical surface 222. The mounting means can be any means such as a sheet 127 of tape with adhesive layers on both sides as shown in FIG. 4. In this embodiment, the tape is preferably placed on the drum 228 and then the support layer 12 is mounted on the tape 127. Alternatively, the mounting means can comprise clamps or a vacuum retaining system 290 as shown in FIGS. 2 and 5. The vacuum retaining system 290 can comprise a vacuum and/or pressure source 292 connected by a conduit 294 to an interior cavity 295 within the drum 228 having closed ends. The conduit 294 can be connected through one of the ends of the drum 228 through a rotatable air tight connection. Passages 296 extend radially through the drum 228 from the interior cavity 295 to the cylindrical surface 222. When the source 292 creates a vacuum in the cavity 295 and the element 10 is mounted on the drum 228, the vacuum force secures the element 10 to, and prevents the element 10 from moving with respect to, the drum 228. In this embodiment, the layer 12 can be mounted in direct contact with the drum 228. Alternatively, as shown in FIG. 5, the element 10 can be secured by a sheet 128 of double sided cushion tape to the sleeve 126 which, in turn, is mounted on the drum 228. The cushion tape 128 can be the same as tape 127 or provide more cushion for the element 10. When the sleeve 126 is used and the source 292 supplies air to the cavity 295, air is forced out of the passages 296 which facilitates sliding the element 10 mounted on the sleeve 126 on the drum 228.

Figure 6:
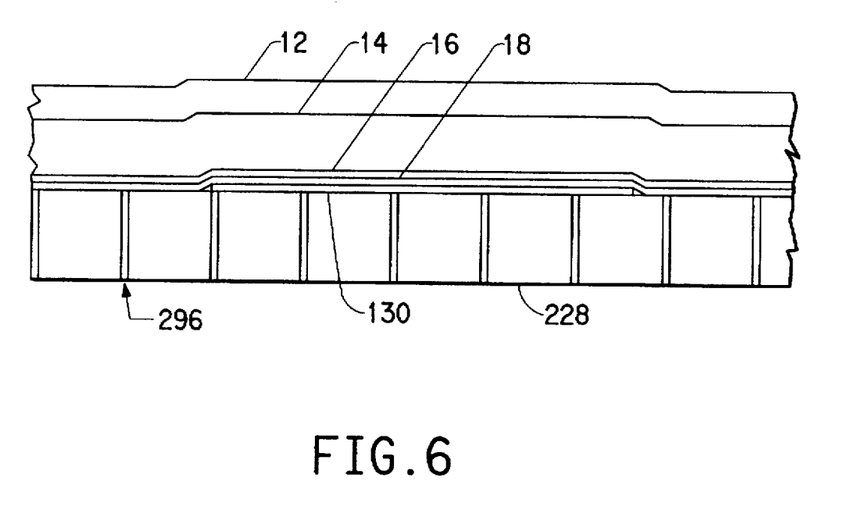
FIG. 6 is a cross sectional view of a third arrangement of the element on the second rotatable drum generally along line 6—6 in FIG. 5 in the direction of the arrows.

FIG. 6 illustrates the arrangement where the photopolymer printing material 10 is adapted to be mounted on the cylindrical surface 222 with the infrared radiation sensitive layer 18 facing radially towards the cylindrical surface 222. In this arrangement, a material capture sheet 130 as described in U.S. Patent Application IM-0971 U.S. Pat. No. 5,506,086 is placed on the cylindrical surface 222 of the vacuum drum 228. Then the element 10 is placed on the material capture sheet 130 and on areas of the cylindrical surface 222 surrounding the material capture sheet. A vacuum force from source 292 secures the material capture sheet 130 and the element 10 on the drum 228. Of course, any means can be used for mounting the material capture sheet 130 and the element 10 on the drum 228.

It is contemplated that the imagewise exposure to infrared radiation and an overall exposure to actinic radiation including non-infrared radiation such as visible and/or ultraviolet radiation, can be carried out in the apparatus 200.

Unless otherwise indicated, the term "flexographic printing plate or element" encompasses plates or elements in any form suitable for flexographic printing, including, but not limited to, flat sheets and seamless continuous cylindrical forms. The photopolymerizable flat sheet elements 10 can be reprocessed by wrapping the element 10 around a cylindrical form, such as the printing sleeve 126 or a printing cylinder itself, and fusing the edges together to form a seamless, continuous element.

Continuous printing elements have applications in the flexographic printing of continuous designs such as in wallpaper, decoration and gift wrapping paper. Furthermore, such continuous printing elements are well-suited for mounting on the laser apparatus 200. The sleeve or cylinder on which the printing element 10 is wrapped when the edges are fused, can be mounted directly into the laser apparatus 200 where it functions as the cylindrical surface 222.

Process for Producing a Flexographic Printing Plate

The process of the invention involves (1) providing the photosensitive printing element 10 as described above; (2) imagewise ablating the infrared sensitive layer 18 of the element 10 with an infrared laser radiation beam having a peak power density as defined above and an energy density as defined above from the apparatus 200 to form a mask; (3) overall exposing the photosensitive element to non-infrared actinic radiation through the mask; and (4) treating the product of step (3) with at least one developer solution to remove (i) the infrared-sensitive layer 18 which was not removed during step (2), (ii) at least areas of the barrier layer(s) 16, if present, which were not exposed to non-infrared actinic radiation, and (iii) areas of the photopolymerizable layer 14 which were not exposed to non-infrared actinic radiation.

Prior to the imagewise ablating step, the coversheet 22 and the optional release layer 20, if present, is/are removed from the element 10. After the removing step and prior to the ablating step, the element 10 is mounted on the rotatable cylindrical surface 222 of the support assembly 228.

The imagewise ablating step is performed by directing the focused modulated beam on the photosensitive element 10. In the infrared imagewise ablating step, material in the infrared-sensitive layer 18 is removed, i.e., ablated or engraved, in the areas exposed to the infrared laser radiation. The areas exposed to laser radiation in the infrared-sensitive layer 18 correspond to those areas in the photopolymerizable layer 14 which will be polymerized to form the final printing plate. After laser ablation, a pattern of actinic radiation-opaque material remains on the barrier layer 16 or directly on the photopolymerizable layer 14 when the barrier layer 16 is not present. The areas in which the infrared-sensitive layer 18 remains corresponds to the areas of the photopolymerizable layer 14 which will be washed out in the formation of the final printing plate.

The ablating step is performed by rotating the cylindrical surface 222 at a speed as described above while simultaneously moving the optical assembly 214 generally parallel to a longitudinal axis of the cylindrical surface 222 to ablate an image in a spiral fashion in the infrared sensitive layer 18 at an advance rate of about an ablating width on the layer 18 per revolution of the cylindrical surface 222. This is done with the infrared laser radiation beam focused to have a diameter as described above.

The next step in the process of the invention is to overall expose the photosensitive element 10 to actinic radiation through the mask. The type of radiation used is dependent on the type of photoinitiator in the photopolymerizable layer 18. The radiation-opaque material in the infrared sensitive layer 18 which remains on top of the barrier layer 16 on the photopolymerizable layer 14 prevents the material beneath from being exposed to the radiation and hence those areas covered by the radiation-opaque material do not polymerize. The areas not covered by the radiation-opaque material are exposed to actinic radiation and polymerize. Any conventional sources of actinic radiation can be used for this exposure step. Examples of suitable visible or UV sources include carbon arcs, mercury-vapor arcs, fluorescent lamps, electron flash units, electron beam units and photographic flood lamps. The most suitable sources of UV radiation are the mercury-vapor lamps, particularly the sun lamps. A standard radiation source is the Sylvania 350 Blacklight fluorescent lamp (FR 48T12/350 VL/VHO/180, 115 w) which has a central wavelength of emission around 354 nm.

The actinic radiation exposure time can vary from a few seconds to minutes, depending upon the intensity and spectral energy distribution of the radiation, its distance from the photosensitive element 10, and the nature and amount of the photopolymerizable composition in layer 14. Typically a mercury vapor arc or a sunlamp is used at a distance of about 1.5 to about 60 inches (3.8 to 153 cm) from the photosensitive element 10. Exposure temperatures are preferably ambient or slightly higher, i.e., about 20° to about 35° C.

The process of the invention usually includes a back exposure or backflash step. This is a blanket exposure to actinic radiation through the support or cushion layer 12. It is used to create a shallow layer of polymerized material, or a floor, on the support side of the photopolymerizable layer 14 and to sensitize the photopolymerizable layer 14. The floor provides improved adhesion between the photopolymerizable layer 14 and the support or cushion layer 12, helps highlight dot resolution and also establishes the depth of the plate relief. The backflash exposure can take place before, after or during the other imaging steps (i.e., the ablating step and the exposing step). It is preferred that it take place just prior to the imagewise ablating with infrared laser radiation on the infrared-sensitive layer 18 side of the element 10.

Any of the conventional radiation sources discussed above can be used for the backflash exposure step. Exposure time generally range from a few seconds up to about a minute.

Following overall exposure to UV radiation through the mask formed by the actinic radiation-opaque material, the image is treated or developed by washing with a suitable developer. The developer removes (i) the infrared-sensitive material which was not removed during the ablation step, (ii) the barrier layer 16, if present, in at least the areas which were not exposed to non-infrared actinic radiation, and (iii) the photopolymerizable layer 14 in the areas which were not exposed to non-infrared actinic radiation. Development is usually carried out at about room temperature. The developers can be organic solutions, water, aqueous or semi-aqueous solutions. The choice of the developer will depend on the chemical nature of the photopolymerizable material to be removed. Suitable organic solution developers include aromatic or aliphatic hydrocarbon and aliphatic or aromatic halohydrocarbon solutions, or mixtures of such solutions with suitable alcohols. Other organic solution developers have been disclosed in published German Application 38 28 551 and U.S. Pat. No. 5,354,645. Suitable semi-aqueous developers usually contain water and a water miscible organic solution and an alkaline material. Suitable aqueous developers usually contain water and an alkaline material. Other suitable aqueous developer combinations are described in U.S. Pat. No. 3,796,602.

Development time can vary, but it is preferably in the range of about 2 to 25 minutes. Developer can be applied in any convenient manner, including immersion, spraying and brush or roller application. Brushing aids can be used to remove the unpolymerized portions of the composition. However, washout is frequently carried out in an automatic processing unit which uses developer and mechanical brushing action to removed the unexposed portions of the plate, leaving a relief constituting the exposed image and the floor.

A pre-development step may be necessary if the infrared-sensitive layer 18 is not removable by the developer solution. An additional developer, which does not effect the polymerized photosensitive material can be applied to remove the infrared-sensitive layer first. This is particularly true when metallic materials are used. In such cases, etching solutions are used, such as 2% aqueous KOH solution.

The process of this invention may be simplified by removing in the treating step with brushing the infrared sensitive layer 18, and/or the barrier layer 16, if present, at the same time as the removal of the unexposed portions of the photopolymer layer 14. The pretreating step may not be necessary in the situation in which the photosensitive element 10 includes a infrared sensitive layer 18 and/or barrier layer 16 which is not substantially soluble, swellable, dispersible, or liftable in the developer solution for the photopolymer layer 14. The infrared sensitive layer 18 and the barrier layer 16 are generally much thinner than the photopolymer layer 14 such that with the aid of brushing or brushing with pressure, the infrared and barrier layers 18,16 can be easily removed from the photopolymer layer 14. Since automatic processing units which use mechanical brushing action are in use commercially for development of photopolymeric plates, the need for brushing action during washout is easily accomplished.

Following solution development, the relief printing plates are generally blotted or wiped dry, and then dried in a forced air or infrared oven. Drying times and temperatures may vary, however, typically the plate is dried for 60 to 120 minutes at 60° C. High temperatures are not recommended because the support 12 can shrink and this can cause registration problems.

Most flexographic printing plates are uniformly post-exposed to ensure that the photopolymerization process is complete and that the plate will remain stable during printing and storage. This post-exposure step utilizes the same radiation source as the main exposure to actinic radiation including non-infrared radiation.

Detackification is an optional post-development treatment which can be applied if the surface is still tacky, such tackiness not generally being removed in post-exposure. Tackiness can be eliminated by methods well known in the art, such as treatment with bromine or chlorine solutions. Such treatments have been disclosed in, for example, Gr uetzmacher U.S. Pat. No. 4,400,459, Fickes et al., U.S. Pat. No. 4,400,460 and German Patent 28 23 300. Detackification can also be accomplished by exposure to radiation sources having a wavelength not longer than 300 nm, as disclosed in European Published Patent Application 0 017 927 and Gibson U.S. Pat. No. 4,806,506.

Imagewise ablation, overall exposure, development and any additional steps can be performed while the plate is mounted in the round. Other advantages which can be obtained using the instant process include increased process speed, better registration and reduced or in some cases no extra mounting time.

Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. In an apparatus for imagewise exposing an infrared sensitive layer, the apparatus comprising:

a support assembly including:
  a rotatable cylindrical surface having a longitudinal axis, and means for mounting said layer on the cylindrical surface, and
  a motor assembly for rotating the cylindrical surface;

a laser assembly for producing an image modulated beam;

an optical assembly including:
  a lens for focusing the directed beam at the layer on the cylindrical surface, and
  a focusing motor assembly for moving the lens with respect to the layer on the cylindrical surface to focus the modulated beam such that the focused modulated beam is adapted to engrave the layer;

a modulated beam delivery carriage assembly including:
  a carriage for supporting the optical assembly,
  a linear track along which the carriage is adapted to move, the track parallel to the longitudinal axis, and
  a translator motor assembly for transporting the carriage along the track to scan the image modulated beam along the layer on the cylindrical surface at a carriage advance rate of about an exposing width of the modulated beam on the layer on the cylindrical surface;

a computer assembly for (i) receiving, generating and/or storing image data representing an image to be exposed on the layer, and (ii) selecting exposure parameters from a set consisting of the cylindrical surface speed, the carriage advance rate, image placement coordinates on the layer, focusing position, and amplitude modulation level; and an electronic control assembly for receiving the image data and the exposure parameters from the computer assembly and processing the image data and the exposure parameters to control the support assembly, the laser assembly, the optical assembly, and the modulated beam delivery carriage assembly to expose the image in a spiral fashion in the layer;

and wherein the improvement comprises:
  the focused modulated beam comprises infrared radiation having a peak power density of 0.1 megaWatts/cm$^2$ to 17 megaWatts/cm$^2$ and is adapted to provide an energy density of 0.5 Joules/cm$^2$ to 5 Joules/cm$^2$ on the layer.

2. The apparatus of claim 1, wherein:

the laser assembly comprises:
  a laser for emitting an output infrared radiation beam having a M$^2$ beam quality value of 4 to 8 and a maximum power of about 50–70 Watts;
  a laser power supply for energizing the laser; and
  an acousto-optic modulator assembly for modulating the laser output beam with image data and for producing an image modulated first order beam having a maximum power of about 22 to about 32 Watts; and the electronic control assembly is adapted to control the acousto-optic modulator assembly.

3. The apparatus of claim 2, wherein the acousto-optic modulator assembly comprises:

an acousto-optic modulator for diffracting a first order beam portion of the laser output beam and passing a zero order beam portion of the laser output beam; and a beam dump for blocking either the first order beam portion or the zero order beam portion.

4. The apparatus of claim 3, wherein the acousto-optic modulator assembly is adapted to provide a modulation rate in a range of about 0.5 megabits/second to about 1.0 megabits/second.

5. The apparatus of claim 1, wherein the drum motor assembly is capable of rotating the cylindrical surface at a speed of about 500 to about 2500 revolutions per minute.

6. The apparatus of claim 1, wherein the lens is adapted to focus the directed beam to have a 1/e$^2$ irradiance diameter of 15 µm to 30 µm at the infrared sensitive layer on the cylindrical surface.

7. The apparatus of claim 1, wherein the modulated beam has a wavelength of 780 to 2000 nanometers.

8. The apparatus of claim 1, wherein the laser output beam has a 1/e$^2$ irradiance diameter at its waist diameter of 2 millimeters to 3 millimeters.

9. The apparatus of claim 1, further comprising a debris extraction system for removing ablated material, the electronic control assembly further adapted to control the debris extraction system.

10. The apparatus of claim 1, wherein the laser assembly includes a Nd:YAG laser.

11. The apparatus of claim 1, wherein the optical assembly further comprises:

a reflector mounted on the carriage for directing the image modulated beam onto the layer on the cylindrical surface.

12. The apparatus of claim 1, wherein the electronic control assembly is further adapted to be used to select at least one exposure parameter from a set consisting of the cylindrical surface speed, the carriage advance rate, the image placement coordinates on the infrared radiation sensitive layer, the focusing position, and the amplitude modulation level.

13. The apparatus of claim 1, wherein the rotatable cylindrical surface comprises an outer surface of a sleeve.

* * * * *